(12) United States Patent
Lee et al.

(10) Patent No.: US 7,326,313 B2
(45) Date of Patent: Feb. 5, 2008

(54) METHOD OF MANUFACTURING A FLEXIBLE DISPLAY

(75) Inventors: Woo-Jae Lee, Gyeonggi-do (KR); Yong-Uk Lee, Gyeonggi-do (KR); Bo-Sung Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/186,684

(22) Filed: Jul. 20, 2005

(65) Prior Publication Data

US 2006/0078671 A1   Apr. 13, 2006

(30) Foreign Application Priority Data

Sep. 24, 2004   (KR)   ............ 10-2004-0077515

(51) Int. Cl.
*B29C 65/50* (2006.01)
*B44C 1/20* (2006.01)
*C09K 19/04* (2006.01)
*B44C 1/24* (2006.01)
*B44C 1/18* (2006.01)
*C09K 19/40* (2006.01)

(52) U.S. Cl. .............. 156/236; 156/247; 156/295; 156/278; 428/1.1; 428/1.6; 428/1.62

(58) Field of Classification Search ........ 428/1.1–1.62; 156/247, 236, 305, 295, 297, 344
See application file for complete search history.

(56) References Cited

U.S. PATENT DOCUMENTS

| | | | |
|---|---|---|---|
| 4,839,174 A * | 6/1989 | Baker et al. ............... 424/447 |
| 5,031,773 A * | 7/1991 | Manico et al. ............. 206/455 |
| 5,514,466 A * | 5/1996 | Yamada et al. ............ 428/328 |
| 5,541,466 A * | 7/1996 | Taylor et al. .............. 313/310 |
| 5,587,096 A * | 12/1996 | Huvard et al. ............. 219/521 |
| 5,690,858 A * | 11/1997 | Nohira et al. ........... 252/299.01 |
| 6,531,180 B1 | 3/2003 | Takushima et al. |
| 6,538,711 B2 * | 3/2003 | Funahata et al. .......... 349/113 |
| 2003/0082889 A1* | 5/2003 | Maruyama et al. ......... 438/455 |
| 2004/0219306 A1* | 11/2004 | Wang et al. ................ 428/1.5 |
| 2005/0053646 A1* | 3/2005 | Yasukochi et al. ......... 424/449 |
| 2005/0237474 A1* | 10/2005 | Nishiki ...................... 349/187 |

(Continued)

FOREIGN PATENT DOCUMENTS

JP   52057298 A *   5/1977

(Continued)

OTHER PUBLICATIONS

Iwamoto, Makato. English translation of DE 19508502, Sep. 1, 1999.*

*Primary Examiner*—Philip Tucker
*Assistant Examiner*—Sonya Mazumdar
(74) *Attorney, Agent, or Firm*—F. Chau & Associates, LLC

(57) ABSTRACT

A method of manufacturing a flexible display is provided, which includes: adhering a plastic substrate on a supporter using an adhesive; forming a thin film pattern on the plastic substrate; and separating the plastic substrate from the supporter using a solvent including THF (tetrahydrofuran). In this manner, the plastic substrate may be tidily separated from the supporter by using THF.

17 Claims, 11 Drawing Sheets

U.S. PATENT DOCUMENTS

| | | | |
|---|---|---|---|
| 2005/0242341 A1* | 11/2005 | Knudson et al. | 257/40 |
| 2006/0055842 A1* | 3/2006 | Lee et al. | 349/58 |

FOREIGN PATENT DOCUMENTS

| | | |
|---|---|---|
| JP | 08-211378 | 8/1996 |
| JP | 08-278519 | 10/1996 |
| JP | 2000-284303 | 3/1999 |
| JP | 2000-252342 | 2/2000 |
| JP | 2000-284243 | 10/2000 |
| JP | 2000-284260 | 10/2000 |
| JP | 2001-027879 | 1/2001 |
| JP | 2001051296 A * | 2/2001 |
| JP | 2002-365614 | 12/2002 |
| KR | 100220206 B | 9/1999 |
| KR | 100326443 | 2/2002 |
| KR | 1020020092817 | 12/2002 |
| KR | 1020040006894 | 1/2004 |
| WO | WO 2004044646 A1 * | 5/2004 |

* cited by examiner

METHOD OF MANUFACTURING A FLEXIBLE DISPLAY

BACKGROUND OF THE INVENTION (a) Field of the Invention

The present invention relates to a method of manufacturing a flexible display, more particularly, to a method of manufacturing a flexible display including a plastic substrate.

(b) Description of the Related Art

A liquid crystal display (LCD) and an organic light emitting display (OLED) are the most widely used flat panel displays.

An LCD includes two panels provided with field-generating electrodes such as pixel electrodes and a common electrode and polarizers, and a liquid crystal (LC) layer interposed therebetween. The LCD displays images by applying voltages to the field-generating electrodes to generate an electric field in the LC layer, which determines orientations of LC molecules in the LC layer to adjust the polarization of the incident light.

An organic light emitting display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and the pair annihilated with emitting light.

However, because the liquid crystal display and the organic light emitting display include fragile and heavy glass substrate, they are not suitable for portability and large scale display.

Accordingly, a display device using flexible substrate such as plastic as well as being light and strong is recently developed However, because plastic substrate has property such as bend and expansibility against heat, thin film patterns such as electrodes and signals are difficult to be formed thereon. To solve this problem, the plastic substrate is attached on glass supporter, then to form thin film patterns on the plastic substrate, then the plastic substrate is taken away from the glass supporter.

At this time, an adhesive to adhere the plastic substrate to glass supporter must have the characteristic such as chemical resistance and high heat resistance to endure against various process conditions for forming thin film patterns, and also can be tidily removed from the plastic substrate after forming thin film patterns.

SUMMARY OF THE INVENTION

A method of manufacturing a flexible display is provided, which includes: adhering a plastic substrate on a supporter using an adhesive; forming a thin film pattern on the plastic substrate; and separating the plastic substrate from the supporter using a solvent including THF (tetrahydrofuran).

The adhesive may include a silicon based adhesive, the solvent may include an additive, and the additive may include an organic halogen.

The additive may include chloroform or dichloromethane, and the amount of the additive may be in the range of about 0–30 percentage.

The adhesive may be in the form of a tape having adhesion surfaces on both sides, and the plastic substrate may be coated by a hard-coating layer.

The hard-coating layer may include acrylic resin.

The plastic substrate may include: an organic layer; an under-coating layer formed on the both surfaces of the organic; a barrier layer formed on the under-coating layer; and a hard-coating layer formed on the barrier layer.

The organic layer may be made of one material selected from polyacrylate, polyethylene-terephthalate, polyethylene-naphthalate, polycarbonate, polyarylate, polyetherimide, polyehtersulfone, and polyimides.

The under-coating layer and the hard-coating layer may include acrylic resin, and the barrier layer may include $SiO_2$ or $Al_2O_3$.

The thin film pattern may include an inorganic layer, and the supporter may include a glass.

The display may include a liquid crystal display or an organic light emitting diode display.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF EMBODIMENTS

Figure 1:
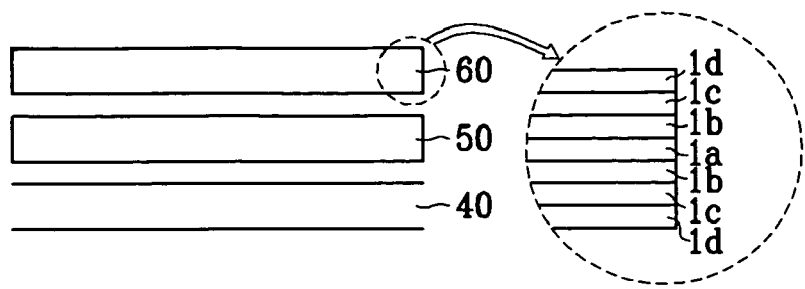
FIGS. 1 to 4 are sectional views illustrating a manufacturing method of a flexible display according to an embodiment of the present invention.

The present invention will now be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on"another element, it can be directly on the other element or intervening elements may also be present. In contrast, when an element is referred to as being "directly on"another element, there are no intervening elements present.

Now, a method of manufacturing a flexible display according to embodiments of the present invention will be described with reference to the accompanying drawings.

First, a method of manufacturing a flexible display will be described in detail with reference to FIGS. 1 to 4.

FIGS. 1 to 4 are sectional views illustrating a manufacturing method of a flexible display according to an embodiment of the present invention.

Referring to FIG. 1, one surface of an adhesion tape 50 having adhesion surfaces on both sides is adhered on one surface of a plastic substrate 60, and the plastic substrate 60 is cut into a predetermined size.

The plastic substrate 60 includes an organic layer 1a made of one material selected from polyacrylate, polyethylene-terephthalate, polyethylene-naphthalate, polycarbonate, polyarylate, polyether-imide, polyehtersulfone, and polyimides. The plastic substrate 60 may further include an under-coating layer 1b made of acrylic resin, a barrier layer 1c of SiO2, Al2O3, and a hard-coating layer 1d made of acrylic resin, which are formed on the both surfaces of the plastic substrate 60. These layers play a role in preventing the plastic substrate 60 from physical and chemical damage.

The adhesion tape 50 includes a polyimide film and adhesives formed on the both surfaces of the polyimide film. It is preferable that the adhesive is made of silicon based adhesive such as silicon pressure sensitive adhesive tape and high heat resistance adhesive.

Figure 2:
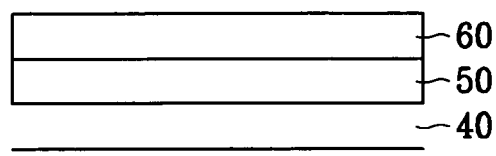

Referring to FIG. 2, the other surface of adhesion tape 50 is adhered on one surface of a glass supporter 40 to complete the combination of the plastic substrate 60 and the glass supporter 40.

Figure 3:
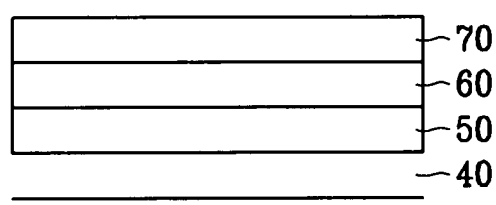
Figure 4:
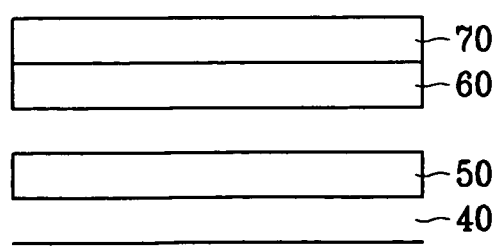

Referring to FIG. 3, a thin film pattern 70 is formed on the plastic substrate 60 attached to the glass supporter 40. At this time, because the plastic substrate 60 is solidly adhered to the glass supporter 40, the plastic substrate 60 does not bend and expanded. Also, because the silicon based adhesive has adhesive strength, the plastic substrate 60 doe not come off the glass supporter 40 when forming the thin film 70, and the problems such as out-gassing is not generated. Furthermore, the silicon based adhesive does not react with acid such as deionized water and etchant which are used to form the thin film pattern 70, and organic solvent such as a stripper to remove the photoresist. Accordingly, the characteristic of the adhesion tape 50 is stably maintained.

Finally, the adhesion tape 50 is removed by melting the adhesion tape 50 using a solvent including tetrahydrofuran (THF).

In this process, THF may damage the plastic substrate 60, but the hard-coating layer and inorganic layer of the thin film pattern 70 prevent the plastic substrate 60 from damaging. For example, if the plastic substrate 60 on which the hard-coating layer is coated soaks in THF for 72 hours, the edge of the plastic substrate 60 is slightly damaged in the range of about 1 to 2 mm due to penetration of THF into the side edges of the plastic substrate 60, on which the hard-coating layer is not coated. The solvent may include an additive to enhance the velocity of dissolution of the adhesion tape 50, and the additive may be a solvent including organic halogen such as chloroform, dichloromethane. The velocity of dissolution of the adhesion tape 50 is accelerated depending on the amount of the additive, but it is preferable that the amount of the additive is in the range of 0–30 percentage to minimize the damage to the plastic substrate 60 during the adhesion tape removal process.

The melting time of the adhesion tape 50 may be changed according to the factors such as the amount of the additive, the hardening degree of the adhesion tape 50, the thickness of the adhesion tape 50. According to one experiment, when the amount of the additive is 30 percent and the melting time is 48 hours, the plastic substrate 60 is damaged. Accordingly it is necessary that the adhesion tape 50 must be soak in the solvent and melted for a time shorter than the aforementioned experimental time.

Chloroform alone may be used as the additive to remove the adhesion tape 50, but the damage of the plastic substrate 60 can be extensive.

The plastic substrate 60 may be used as a panel for a liquid crystal display or organic light emitting diode display, and will be described in detail below with reference to the drawings.

Figure 5:
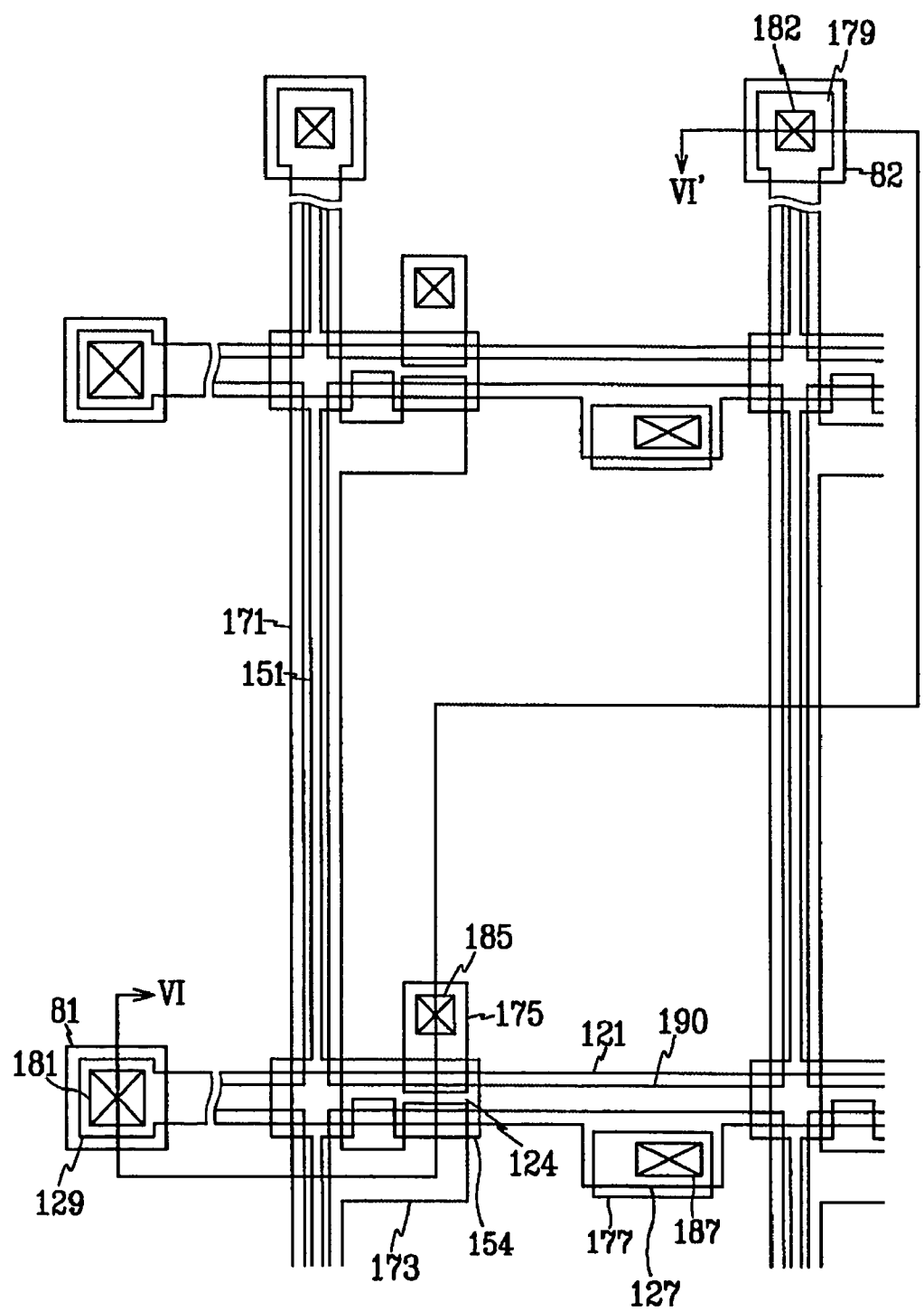
FIG. 5 is a layout view of a TFT array panel for an LCD according to an embodiment of the present invention.
Figure 6:
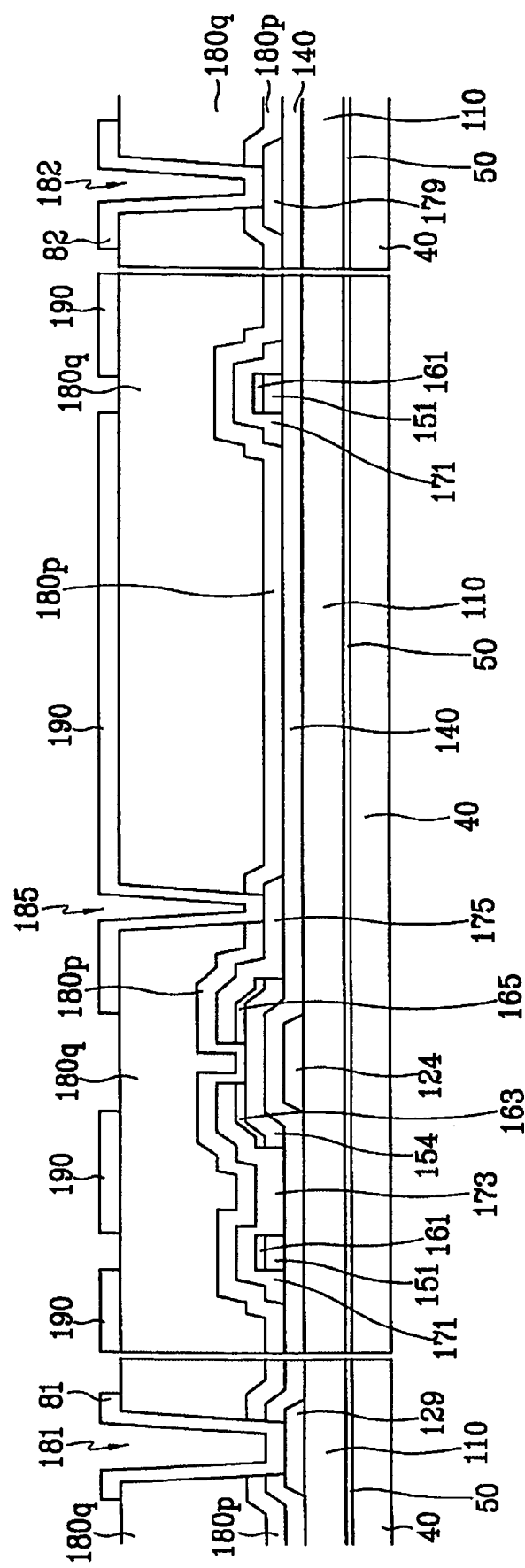
FIG. 6 is a sectional view of the TFT array panel shown in FIG. 5 taken along the lines VI–VI'.

FIG. 5 is a layout view of a TFT array panel for an LCD according to an embodiment of the present invention, and FIG. 6 is a sectional view of the TFT array panel shown in FIG. 5 taken along the lines VI–VI'. FIGS. 5 and 6 show the structure of the TFT array panel before the glass support is removed.

A plurality of gate lines 121 are formed on an insulating substrate 110 such as a plastic substrate adhered to a glass supporter 40 by an adhesion tape 50.

The gate lines 121 extend substantially in a transverse direction and are separated from each other and transmit gate signals. Each gate line 121 includes a plurality of portions forming a plurality of gate electrodes 124, a plurality of projections 127 protruding downward and an end portion 129 having a large area for contact with another layer or an external driving circuit. The gate lines 121 may extend to be connected a driving circuit that may be integrated on the insulating substrate 110.

The gate lines 121 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 may have a multi-layered structure including two films having different physical characteristics. One of the two films is preferably made of low resistivity metal including Al containing metal for reducing signal delay or voltage drop in the gate lines 121. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al (Al—Nd alloy) film and a lower Al (Al alloy) film and an upper Mo film.

In addition, the lateral sides of the gate line 121 are tapered, and the inclination angle of the lateral sides with respect to a surface of the substrate 110 ranges about 30–80degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") or polysilicon are formed on the gate insulating layer 140. Each semiconductor stripe 151 extends substantially in a longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30–80 degrees.

A plurality of data lines 171, a plurality of drain electrodes 175 and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the metal pieces 178 are preferably made of refractory metal such as Cr, Mo, Ti, Ta or alloys thereof. However, they may also have a multilayered structure including a low-resistivity film (not shown) and a good-contact film (not shown).

Like the gate lines 121, the data lines 171 and the drain electrodes 175 have tapered lateral sides, and the inclination angles thereof range about 30–80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A lower passivation layer 180p preferably made of inorganic material such as silicon nitride or silicon oxide is formed on the data lines 171, the drain electrodes 175, the storage electrode capacitors 177 and the exposed portions of the semiconductor stripes 151.

An upper passivation layer 180q is formed on the lower passivation layer 180p. The upper passivation layer 180q is preferably made of photosensitive organic material having a good flatness characteristic, or low dielectric insulating material such as a-Si:C:O and a-Si:O:F formed by plasma enhanced chemical vapor deposition (PECVD).

One of the lower and the upper passivation layers 180p and 180q may be omitted in other embodiments.

The upper and lower passivation layer 180p and 180q has a plurality of contact holes 182, 185 and 187 exposing the end portions 179 of the data lines 171, the drain electrodes 175, and the storage conductors 177, respectively. The upper and lower passivation layer 180p and 180q and the gate insulating layer 140 have a plurality of contact holes 181 exposing end portions 129 of the gate lines 121.

A plurality of pixel electrodes 190 and a plurality of contact assistants 81 and 82, which are preferably made of IZO or ITO, are formed on the upper passivation layer 180q.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after the TFT is turned off. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio but it is optional.

The contact assistants 81 and 82 are connected to the exposed end portions 129 of the gate lines 121 and the exposed end portions 179 of the data lines 171 through the contact holes 181 and 182, respectively. The contact assistants 81 and 82 are not requisites but preferred to protect the exposed portions 129 and 179 and to complement the adhesiveness of the exposed portion 129 and 179 and external devices.

The contact assistant 81 play a part in connecting the end portions 129 of the gate lines 121 and a gate driving circuit when the gate driving circuit to supply gate signals is integrated on the insulating substrate 110, and may be omitted.

According to another embodiment of the present invention, the pixel electrodes 190 are made of a transparent conductive polymer. For a reflective LCD, the pixel electrodes 190 are made of an opaque reflective metal. In these cases, the contact assistants 81 and 82 may be made of material such as IZO or ITO different from the pixel electrodes 190.

A method of manufacturing the TFT array panel shown in FIGS. 5 and 6 according to an embodiment of the present invention will be now described in detail with reference to FIGS. 7 to 14 as well as FIGS. 5 and 6.

Figure 7:
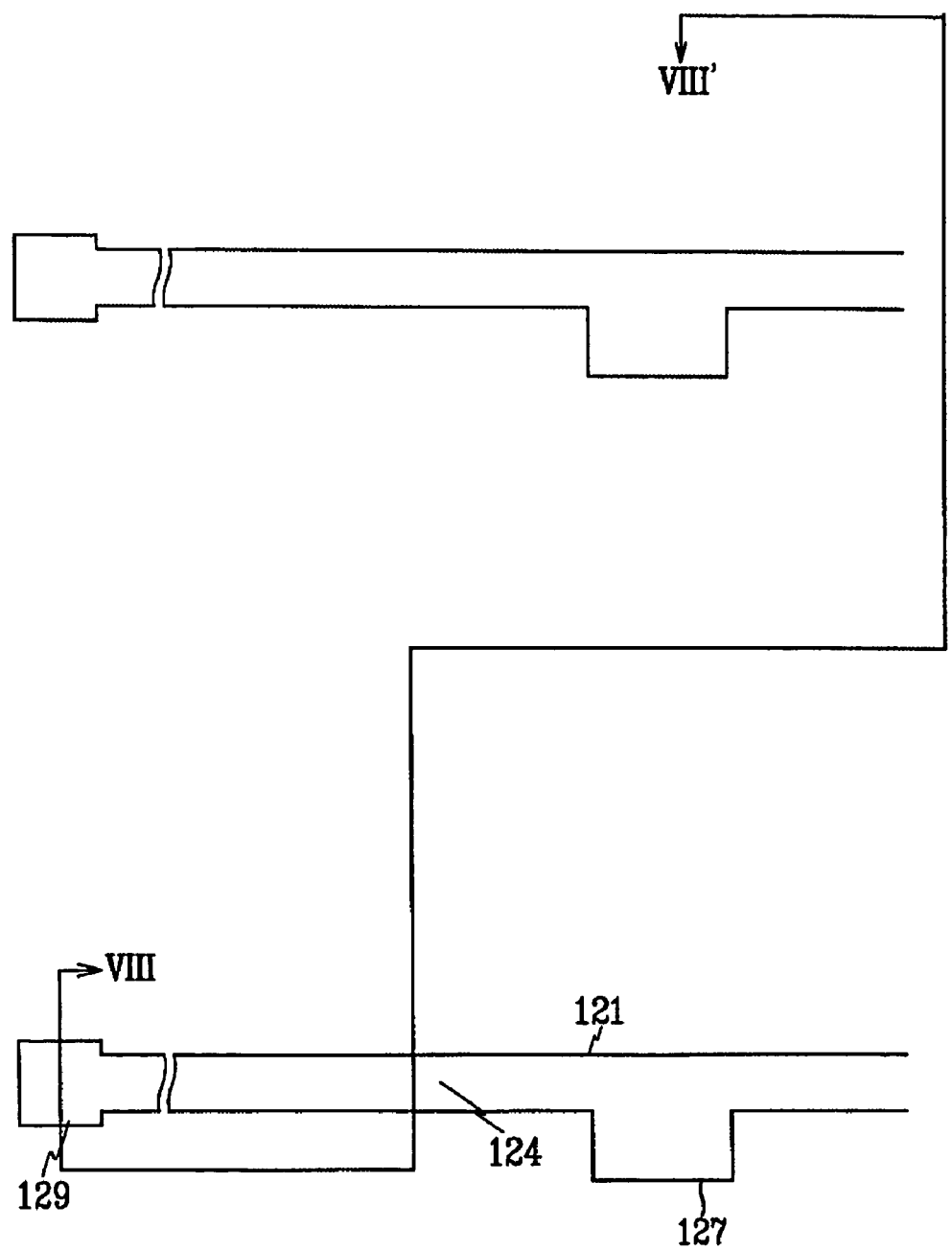
FIGS. 7, 9, 11 and 13 are layout views of a TFT array panel shown in FIGS. 5 and 6 in intermediate steps of a manufacturing method thereof according to an embodiment of the present invention.
Figure 8:
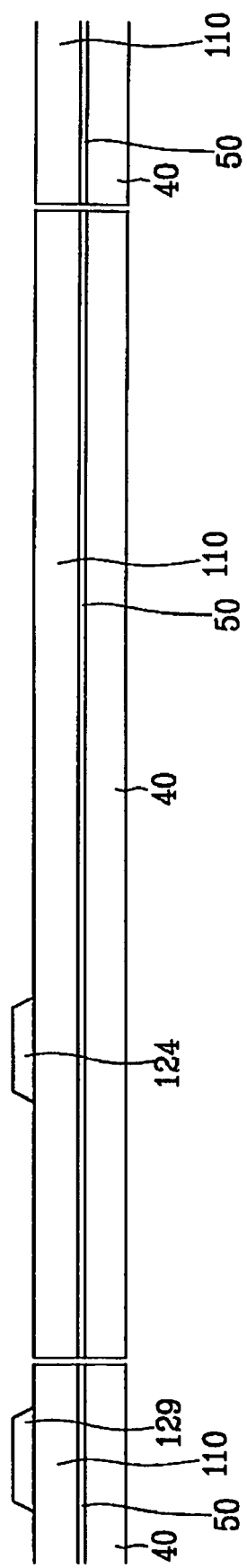
FIG. 8 is a sectional view of the TFT array panel shown in FIG. 7 taken along the line VIII–VIII'.
Figure 9:
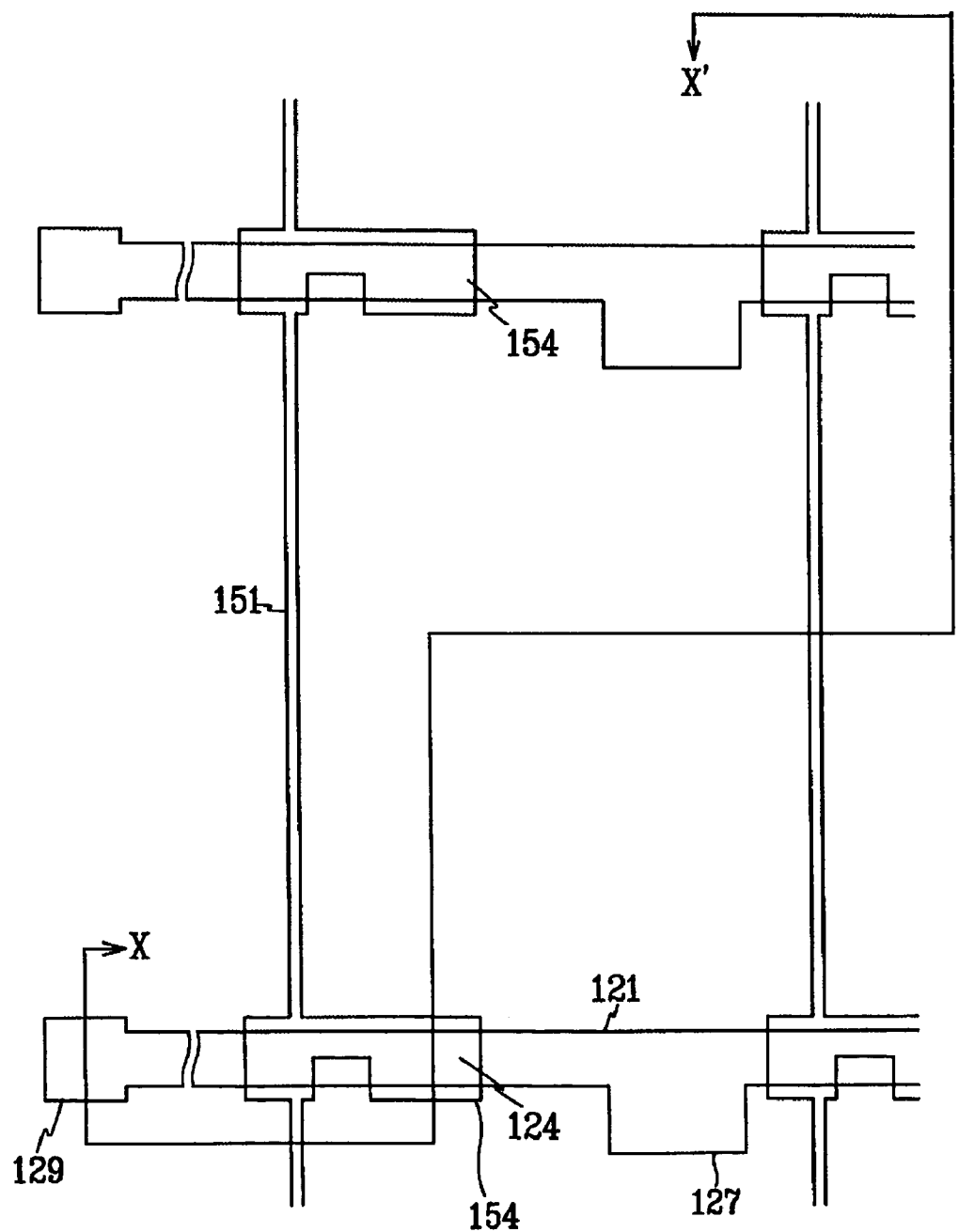
Figure 10:
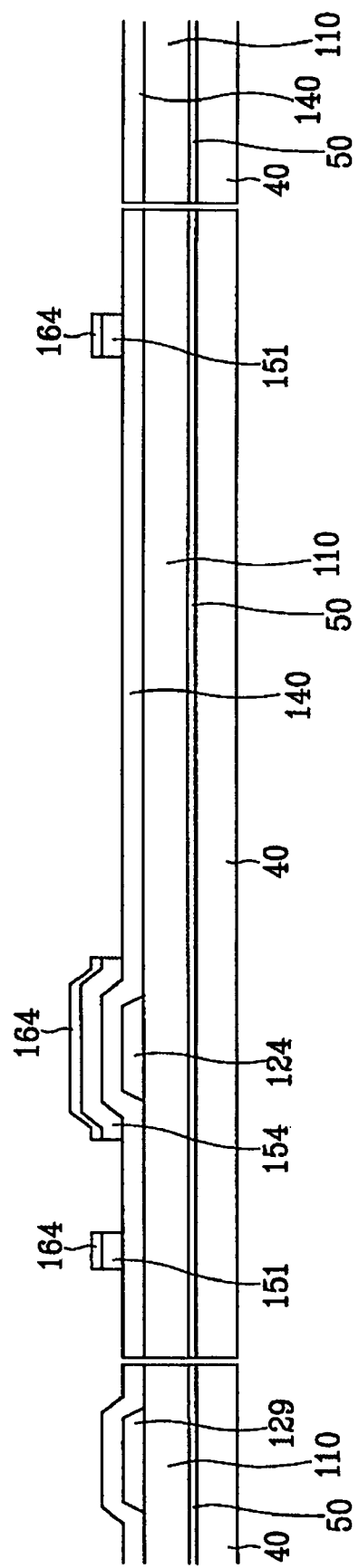
FIG. 10 is a sectional view of the TFT array panel shown in FIG. 9 taken along the line X–X'.
Figure 11:
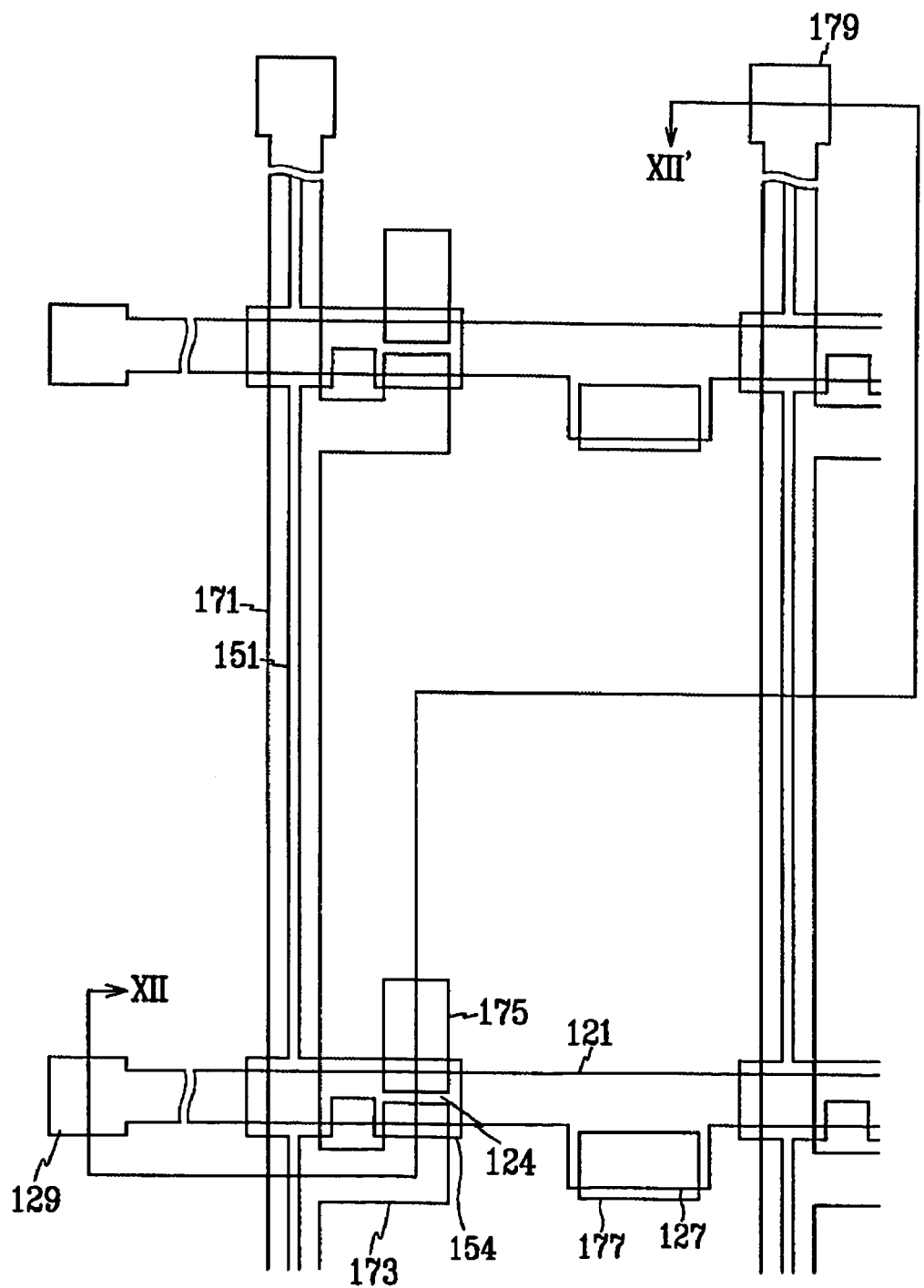
Figure 12:
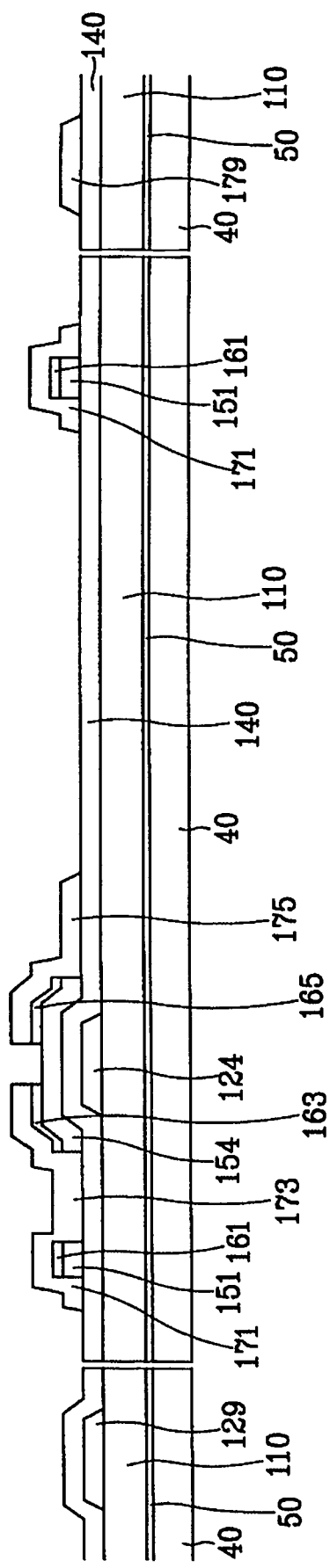
FIG. 12 is a sectional view of the TFT array panel shown in FIG. 11 taken along the line XII–XII'.
Figure 13:
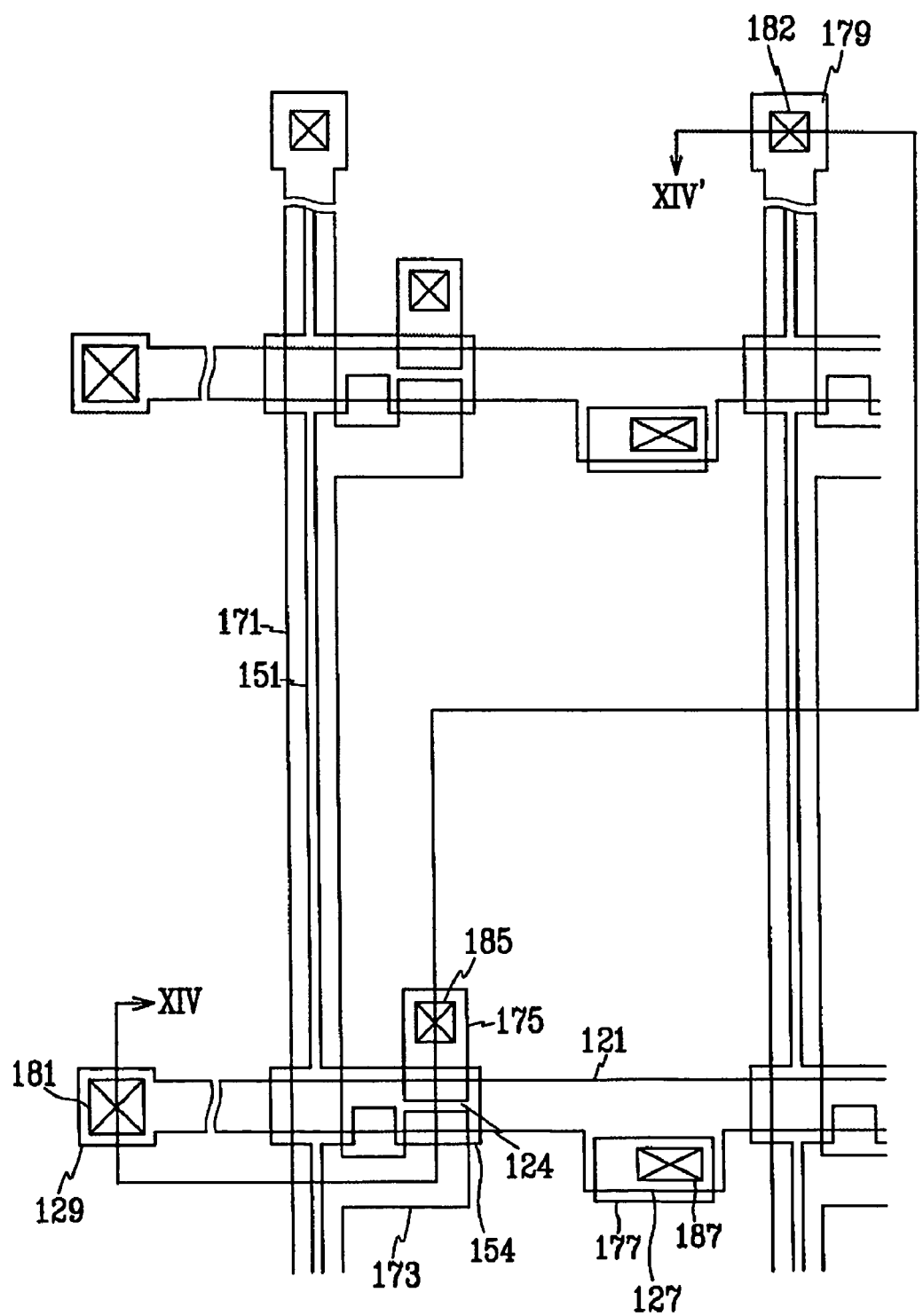
Figure 14:
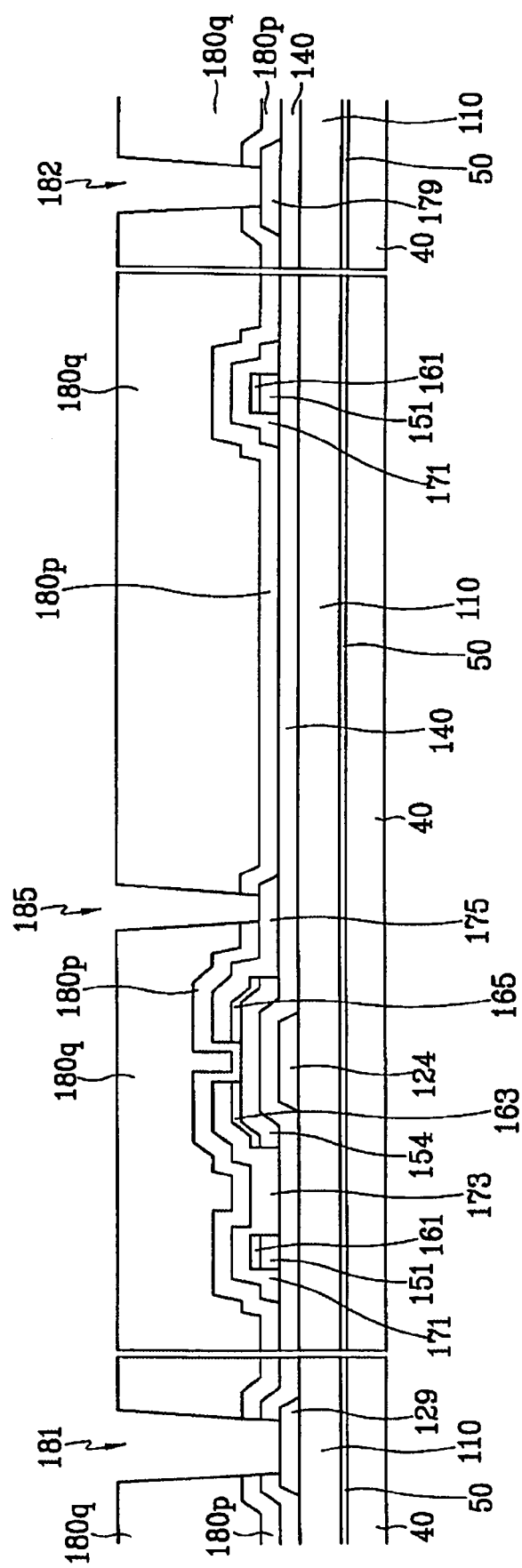
FIG. 14 is a sectional view of the TFT array panel shown in FIG. 13 taken along the line XIV–XIV'.

FIGS. 7, 9, 11 and 13 are layout views of a TFT array panel shown in FIGS. 5 and 6 in intermediate steps of a manufacturing method thereof according to an embodiment of the present invention, FIG. 8 is a sectional view of the TFT array panel shown in FIG. 7 taken along the line VIII–VIII', FIG. 10 is a sectional view of the TFT array panel shown in FIG. 9 taken along the line X–X', FIG. 12 is a sectional view of the TFT array panel shown in FIG. 11 taken along the line XII–XII', and FIG. 14 is a sectional view of the TFT array panel shown in FIG. 13 taken along the line XIV–XIV'.

As shown in FIGS. 7 and 8, a plastic substrate 110 is adhered to upper surface a supporter 40 such as transparent glass using an adhesion tape 50, then a metal film is sputtered and patterned by photo-etching with a photoresist pattern on the plastic substrate 110 to form a plurality of gate lines 121 including a plurality of gate electrodes 124 and a plurality of projections 127.

Referring to FIGS. 9 and 10, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Referring to FIGS. 11 and 12, a metal film is sputtered and etched using a photoresist to form a plurality of data lines 171 including a plurality of source electrodes 173, a plurality of drain electrodes 175, and a plurality of storage capacitor conductors 177.

Before or after removing the photoresist, portions of the extrinsic semiconductor stripes 164, which are not covered with the data lines 171, the drain electrodes 175, and the storage capacitor conductors 177, are removed by etching to complete a plurality of ohmic contact stripes 161 including a plurality of projections 163 and a plurality of ohmic contact islands 165 and to expose portions of the intrinsic semiconductor stripes 151. Oxygen plasma treatment may follow thereafter in order to stabilize the exposed surfaces of the semiconductor stripes 151.

Referring to FIGS. 13 and 14, a lower passivation layer 180p preferably made of inorganic material such as silicon nitride or silicon oxide is formed by plasma enhanced chemical vapor deposition (PECVD), and an upper passivation layer 180q preferably made of photosensitive organic material is coated on the lower passivation layer 180p. Then, the upper passivation layer 180q is exposed to light through a photo mask and developed to expose the portion of the lower passivation layer 180p, and the exposed portion of the lower passivation layer 180p is dry etched along with the gate insulating layer 140 to form a plurality of contact holes 181, 182, 185 and 187.

Referring to FIGS. 5 and 6, a conductive layer preferably made of transparent material such as ITO, IZO and a-ITO (amorphous indium tin oxide) is deposited by sputtering and is etched using the photoresist to form a plurality of pixel electrodes 190 and a plurality of contact assistants 81 and 82. The process forming an alignment layer may be added.

After forming a plurality of thin films of the thin film transistor array panel as above described, the adhesion tape 50 is removed using THF, or THF and additive to complete the thin film transistor array panel including the plastic substrate 110.

The method of FIGS. 1 to 4 as above described may be adapted to other flat panel display devices such as a panel for OLED.

As above descriptions, the thin film pattern is formed on the plastic substrate adhered to the glass supporter using the adhesive made of silicon based material, then the adhesive is removed using a solvent including THF. Accordingly, the formations of the thin film patterns may be stably preformed, and the adhesive may be tidily removed from the plastic substrate.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a flexible display, the method comprising:
    adhering a first surface of a plastic substrate on a supporter using an adhesive, wherein an entire first surface of the plastic substrate receives the adhesive;
    forming a thin film pattern on a second surface of the plastic substrate; and
    separating the plastic substrate from the supporter using a solvent including THF (tetrahydrofuran).

2. The method of claim 1, wherein the adhesive induces a silicon based adhesive.

3. The method of claim 1, wherein the solvent includes an additive.

4. The method of claim 3, wherein the additive includes an organic halogen.

5. The method of claim 4, wherein the additive includes chloroform or dichloromethane.

6. The method of claim 5, wherein the amount of the additive is in the range of from more than 0 percentage to about 30 percentage.

7. The method of claim 1, wherein the adhesive comprises a tape having adhesion surfaces on both sides of the tape.

8. The method of claim 1, wherein the plastic substrate is coated by a hard-coating layer.

9. The method of claim 8, wherein the hard-coating layer includes acrylic resin.

10. The method of claim 1, wherein the plastic substrate includes:
    an organic layer;
    an under-coating layer formed on the both surfaces of the organic layer;
    a barrier layer formed on the under-coating layer; and
    a hard-coating layer formed on the barrier layer.

11. The method of claim 10, wherein the organic layer is made of one material selected from polyacrylate, polyethylene-terephthalate, polyethylene-naphthalate, polycarbonate, polyarylate, polyether-imide, polyehtersulfone, and polyimides.

12. The method of claim 10, wherein the under-coating layer and the hard-coating layer include acrylic resin.

13. The method of claim 10, wherein the barrier layer includes SiO2 or Al2O3.

14. The method of claim 10, wherein the thin film pattern includes an inorganic layer.

15. The method of claim 1, wherein the supporter includes a glass.

16. The method of claim 1, wherein the display includes a liquid crystal display.

17. The method of claim 1, wherein the display includes an organic light emitting diode display.

* * * * *